US 6,660,556 B2

(12) United States Patent
Hashimoto et al.

(10) Patent No.: US 6,660,556 B2
(45) Date of Patent: Dec. 9, 2003

(54) METHOD OF MANUFACTURING A SOLAR BATTERY

(75) Inventors: Masao Hashimoto, Kanagawa (JP); Yasuhiro Iino, Kanagawa (JP); Shinichiro Uchiyama, Kanagawa (JP)

(73) Assignee: Bridgestone Corporation, Tokyo (JP)

( * ) Notice: Subject to any disclaimer, the term of this patent is extended or adjusted under 35 U.S.C. 154(b) by 391 days.

(21) Appl. No.: 09/937,846

(22) Filed: Sep. 28, 2001

(65) Prior Publication Data

US 2002/0179139 A1 Dec. 5, 2002

Related U.S. Application Data

(63) Continuation of application No. PCT/JP01/01001, filed on Feb. 14, 2001.

(30) Foreign Application Priority Data

Feb. 18, 2000 (JP) .......................... 2000-041527
Jul. 27, 2000 (JP) .......................... 2000-227388

(51) Int. Cl.[7] .................... H01L 31/048; H01L 31/18
(52) U.S. Cl. .................. 438/66; 136/251; 136/244; 438/64; 264/293; 428/174; 428/220; 427/74; 427/385.5
(58) Field of Search .................. 136/251, 244; 438/64, 66; 264/293; 428/174, 220; 427/74, 385.5

(56) References Cited

U.S. PATENT DOCUMENTS

| 4,848,564 A | * | 7/1989 | Scheller et al. ............ 206/83.5 |
| 5,589,006 A | * | 12/1996 | Itoyama et al. ............. 136/248 |
| 5,782,994 A | * | 7/1998 | Mori et al. ................. 136/251 |
| 2001/0045229 A1 | * | 11/2001 | Komori et al. ............. 136/251 |

FOREIGN PATENT DOCUMENTS

| JP | 59-22978 | | 2/1984 |
| JP | 8-139347 | | 5/1996 |
| JP | 9-18030 | | 1/1997 |
| JP | 9-92867 | | 4/1997 |
| JP | 10-275928 | | 10/1998 |
| JP | 2000-183388 | | 6/2000 |
| JP | 2001-183388 A | * | 6/2000 |
| WO | WO 99/56317 | | 11/1999 |

* cited by examiner

Primary Examiner—Alan Diamond
(74) Attorney, Agent, or Firm—Kanesaka & Takeuchi

(57) ABSTRACT

A sealing film is used for sealing a solar cell, and including an EVA film formed of ethylene-vinyl acetate copolymer resin. The sealing film has concavities formed by embossing. A percentage defined by $V_H/V_A \times 100\%$ is in a range from 20% to 50%, wherein $V_H$ is the total volume of the concavities per unit area of the sealing film, and $V_A$ is the apparent volume of the sealing film which is the product of the maximum thickness of the film and the unit area.

4 Claims, 2 Drawing Sheets

METHOD OF MANUFACTURING A SOLAR BATTERY

CROSS REFERENCE TO RELATED APPLICATION

This is a continuation application of PCT/JP01/01001 filed on Feb. 14, 2001.

FIELD OF THE INVENTION

The present invention relates to a method of manufacturing a solar battery and, more particularly, to a method of manufacturing a solar battery employing a cell sealing film.

BACKGROUND OF THE INVENTION

Solar cells which directly convert sunlight to electric energy are effective utilization of natural resources and prevention against environmental pollution.

A solar battery comprises, as shown in FIG. 2, a glass substrate 11 as a front-side transparent protective member, a back-side protective member (backside covering member) 12, ethylene-vinyl acetate copolymer (EVA) resin films 13A, 13B as sealing layers arranged between the glass substrate 11 and the back-side protective member 12, and solar cells such as silicon photovoltaic elements 14 sealed by the EVA resin films 13A, 13B.

To manufacture this solar battery, the glass substrate 11, the sealing EVA resin film 13A, silicone photovoltaic elements 14, the sealing EVA resin film 13B and the backside covering member 12 are successively overlaid in this order and integrated together by heating and pressurizing the EVA by virtue of the crosslinking of the EVA.

The sealing EVA resin films 13A, 13B are generally manufactured by means of a film forming method such as T-die extrusion or calendaring in which melt resin is extruded through a linear slit of an extruder die and is then quenched by a cooling roll or in a water quench bath.

As for adhesive films, an embossing treatment is sometimes applied to a formed film to provide a rough surface in order to improve the welding property and the contact bonding property.

Conventional sealing EVA resin films are not processed by the embossing treatment. Alternatively, even if processed by the embossing treatment, the depth of roughness formed by the embossing treatment is of the order of 5 $\mu$m at the most. It should be noted that the thickness of a normal EVA resin film is several hundred $\mu$m.

In the manufacture of a solar battery, since the EVA resin films are pressed against solar cells during the heating and pressurizing in the sealing integration process, some solar cells may be unfortunately broken due to this pressure. There is another problem that air is entrapped due to insufficient deaerating for the sealing integration and/or EVA resin film is deformed to flow out due to the heating and pressurizing and the resin may spew out of a side end of a laminated body, thus reducing the product yield.

SUMMARY OF THE INVENTION

It is an object of the present invention to provide a film for sealing a solar cell which can effectively prevent the solar cell from being damaged, prevent inferior deaeration, and prevent resin of the film from flowing out during the sealing integration process of manufacture of a solar battery, and which enables the manufacture of solar batteries with high product yield, and also to provide a method of manufacturing a solar battery using said layers for sealing solar cells.

A film for sealing a solar cell according to the present invention includes a film formed of ethylene-vinyl acetate copolymer resin. The film is processed by an embossing treatment to have concavities. A percentage P defined by the following equation is in a range from 5% to 80%;

$$P = V_H/V_A \times 100 \ (\%)$$

wherein $V_H$ is the total volume of said concavities per unit area of the film and $V_A$ is the apparent volume of the film which is the product of the maximum thickness of the film and the unit area.

The film for a sealing solar cell which is composed of a film processed by an embossing treatment to have the percentage (concavity ratio) P from 5% to 80% enables the manufacture of a solar battery with high product yield.

DETAILED DESCRIPTION OF THE PREFERRED EMBODIMENTS

Figure 1:
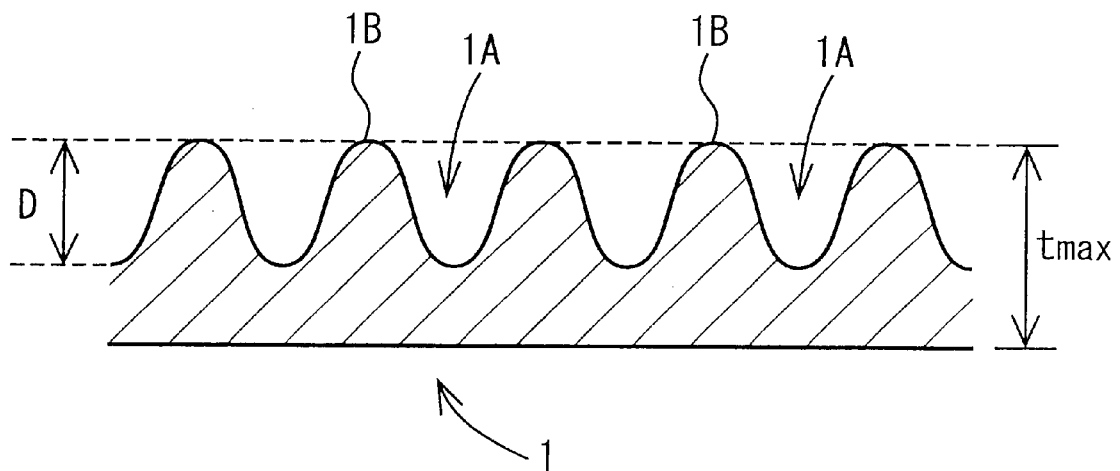
FIG. 1 is a sectional view showing an embodiment of the sealing film according to the present invention.
Figure 2:
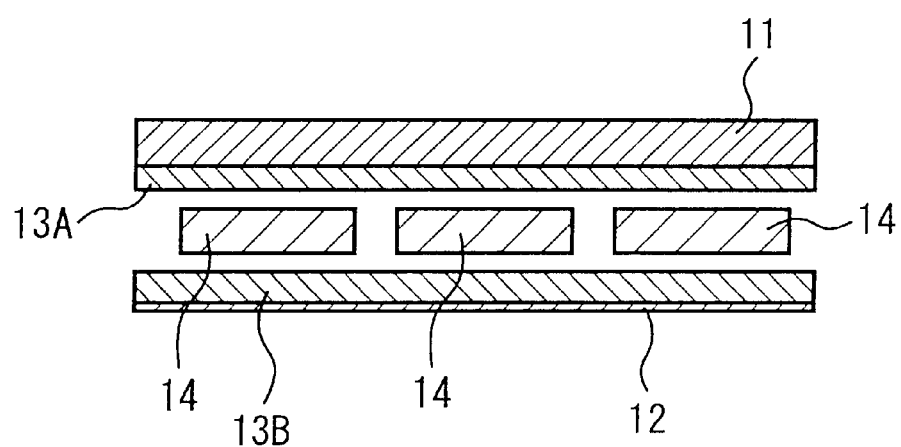
FIG. 2 is a sectional view showing a method of manufacturing a solar battery.

The percentage (concavity ratio) P can be obtained from the following calculation. In a film 1 having an embossed surface as shown in FIG. 1, the apparent volume $V_A$ (mm$^3$) of the film 1 is the product of the maximum thickness $t_{max}$ (mm) of the film 1 and unit area (for example, 1 m$^2$=1000× 1000=10$^6$ mm$^2$), that is, the apparent volume $V_A$ is calculated by the following equation:

$$V_A \ (mm^3) = t_{max} \times 10^6$$

On the other hand, the actual volume $V_0$ (mm$^3$) of the film 1 per unit area is obtained from the specific gravity $\rho$ (g/mm$^3$) of resin forming the film 1 and the actual weight W (g) of the film 1 per the unit area (for example 1 m$^2$) by using the following equation:

$$V_0 \ (mm^3) = W/\rho$$

The total volume $V_H$ (mm$^3$) of concavities 1A per unit area of the film 1 is assumed to be equal to a value obtained by subtracting the actual volume $V_0$ from the apparent volume $V_A$ of the film 1, that is, the total volume $V_H$ is calculated by the following equation:

$$V_H \ (mm^3) = V_A - V_0$$

$$= V_A - (W/\rho)$$

Accordingly, the concavity ratio (%) can be obtained by the following equation:

$$\text{Concavity ratio P } (\%) = (V_H/V_A) \times 100$$

$$= \{V_A - (W/\rho)\}/V_A \times 100$$

$$= \{1 - W/(\rho \cdot V_A)\} \times 100$$

$$= \{1 - W/(\rho \cdot t_{max} \cdot 10^6)\} \times 100$$

It should be noted that the concavity ratio (%) may be obtained by taking micrographs of sections and embossed surface of the actual film and image-processing the micrographs, besides the way of calculating from the equations.

An EVA film of which the concavity ratio P (%) is in a range from 5% to 80%, preferably from 20% to 50% can provide cushioning against the heating and pressurizing during the sealing integration process in the manufacture of a solar battery, thereby preventing solar cells from being broken. That is, when the film is subjected to a local pressure, one or more of convexities on which the pressure is applied are deformed or collapsed, thereby preventing the solar cell from being subjected to large local stress.

Because of the concavities formed on the film, wide air passages can be ensured during the heating and pressurizing in the sealing integration process, thereby improving the deaeration property. This prevents insufficient deaerating and reduces the time taken for the sealing integration.

During the heating and pressurizing in the sealing integration process for manufacturing a solar battery, flowing resin enters into the concavities, thereby preventing the resin from spewing out of the laminated body.

As a result, high quality solar batteries can be manufactured with improved product yield.

According to the present invention, the depth of the concavities formed by the embossing treatment is preferably in a range from 20% to 95%, specifically from 50% to 95%, more specifically from 65% to 95% of the maximum thickness of the film.

In the present invention, the depth of the concavities formed by the embossing treatment is a height difference D between the top of the convexities 1B and the bottom of the concavities 1A in the rough surface of the film 1 formed by the embossing treatment as shown in FIG. 1. In case that only one surface of the film is processed by the embossing treatment, the maximum thickness $t_{max}$ of the film is a distance between the top of the convexities 1B and the other surface (rear surface). In case that the both surfaces of the film are processed by the embossing treatment, the maximum thickness $t_{max}$ of the film is a distance (distance in the thickness direction) between the respective tops of the convexities on the both surfaces.

The embossing treatment may be conducted to the both surfaces or only one surface of the film. In case of only one surface of the film is processed by the embossing treatment, the maximum thickness $t_{max}$ of the film is preferably in a range from 50 μm to 2000 μm.

The content of vinyl acetate in the EVA resin forming the film as the cell sealing layer is preferably in a range from 10 to 40 weight %, specifically from 10 to 36 weight %.

The method of manufacturing a solar battery according to the present invention comprises steps of laminating a front-side transparent protective member, a cell sealing film, the solar cells, another cell sealing layer, and a backside protective member to make a laminated body, and pressurizing and heating the laminated body to be integrated. Each cell sealing layer is the cell sealing film of the present invention.

In this method of manufacturing the solar battery, it is preferable to pressurize and heat the laminated body without allowing the cell sealing film to flow out of the laminated body. It is preferable that the laminated body is placed on a hot plate and enclosed by a soft sheet and the hot plate. In this case, the laminated body is pressurized with atmospheric pressure by vacuuming the enclosed inside and is heated by the hot plate.

Hereinafter, a preferred embodiment of the present invention will be described. It should be noted that the preferred embodiment as described below is just an illustrative example of the present invention.

FIG. 1 is a sectional view of an example of a cell sealing layer according to the present invention. The layer 1 is composed of a film having roughness formed by the embossing treatment. The film has the concavity ratio P of 5% to 80%. The concavity ratio less than 5% provides poor cushioning and therefore does not provide a function of preventing the solar cells from being broken in the sealing integration process. Further, sufficient air passages can not be obtained, leading to inferior deaeration, and therefore does not provide a function of preventing the resin from flowing and spewing out of the laminated body. The concavity ratio P more than 80% facilitates entrapment of air during the sealing integration process, thus easily leaving air in the solar battery as a production. It is specifically preferable that the concavity ratio P is in a range from 20% to 50%.

The depth D of the concavities formed by the embossing treatment is preferably in a range from 20% to 95%, specifically from 50% to 95 of the maximum thickness $t_{max}$ of the film. Hereinafter, the percentage of the depth D of the concavities relative to the maximum thickness $t_{max}$ of the film will be sometimes referred to "depth ratio" of the concavities.

The embossing treatment may be conducted to only one surface or the both surfaces of the film. Since the embossing treatment is conducted to have deep concavities in the present invention, the embossing treatment is normally preferably conducted to only one surface of the film. The film is placed on the solar cell in such a manner that its embossed surface contacts the solar cell.

In case that only one surface of the film is processed by the embossing treatment, the maximum thickness $t_{max}$ of the film is preferably in a range from 50 μm to 2000 μm, specifically from 100 μm to 1000 μm, more specifically from 200 μm to 800 μm.

The cell sealing film of the present invention can be manufactured by forming EVA resin compositions containing cross-linking agent into a film according to any method and processing the film by the embossing treatment to form convexities and concavities having a predetermined depth.

Suitable EVA resin compositions forming the sealing film according to the present invention will be described.

The content of vinyl acetate in the EVA resin is 40 weight % or less, preferably from 10 to 40 weight %, more preferably from 10 to 36 weight %, specifically preferably from 10 to 33 weight %.

When the EVA resin contains vinyl acetate more than 40 weight %, the resin quite easily flow so that the resin easily spews out during the sealing integration process. In addition, the stickiness of the resultant sealing film is increased so that the sealing film easily tacks, thus making the sealing film difficult to handle.

When the EVA resin contains vinyl acetate less than 10 weight %, the resultant sealing film is difficult to process and has inferior deaeration property because the film is too hard.

The melt flow rate of the EVA resin is preferably from 0.7 to 20, more preferably from 1.5 to 10.

A cross-linking agent is preferably added in the EVA resin to have cross-linked structure for improving the weather-ability. An organic peroxide having radical generation temperature equal to or more than 100° C. is preferably used as this cross-linking agent. More particularly, an organic peroxide having decomposition temperature equal to or more than 70° C. for a half life of 10 hours is preferably used in view of the stability when mixed. Specific examples used as the organic peroxide are 2,5-dimethylhexane; 2,5-dihydroperoxide; 2,5-dimethyl-2,5-di(t-butylperoxy)hexane; 3-di-t-butylperoxide; t-dicumyl dicumyl peroxide; 2,5-dimethyl-2,5-di(t-butylperoxy)hexyne; dicumyl peroxide; α, α'-bis (t-butyl peroxy isopropyl)-benzene; n-butyl-4,4-bis (t-butyl-peroxy)butane; 2,2-bis (t-butyl-peroxy)-butane; 1,1-bis (t-butyl-peroxy)cyclohexane; 1,1-bis (t-butyl-peroxy)-3,3,5-trimethylcyclohexane; t-butyl peroxy benzoate; and benzoyl peroxide. The content of the organic peroxide is preferably 5 parts by weight or less, specifically preferably 1–3 parts by weight, relative to 100 parts by weight of EVA resin.

In order to increase the bonding strength to the photovoltaic elements of the solar battery, silane coupling agent may be added in the EVA resin. Specific examples of the silane coupling agent for this purpose are, but not limited to, γ-chloropropyl trimethoxy silane; vinyltrichlorosilane; vinyltriethoxysilane; vinyl-tris-(β-methoxyethoxy) silane; γ-methacryloxypropyl trimethoxy silane; β-(3,4-ethoxycyclohexyl) ethyl trimethoxy silane; γ-glycidoxypropyltrimethoxy silane; vinyltriacetoxy silane; γ-mercaptopropyl trimethoxy silane; γ-aminopropyl trimethoxy silane; and N-β-(aminoethyl)-γ-aminopropyl trimethoxy silane. The content of the silane coupling agent is preferably 5 parts by weight or less, specifically preferably 0.1–2 parts by weight, relative to 100 parts by weight of EVA resin.

In order to increase the gel rate of the EVA resin and improve the durability, a crosslinking assistant may be added to the EVA resin. Specific examples of the crosslinking assistant for this purpose are, but not limited to, trifunctional crosslinking assistants such as triallyl isocyanurate and triallyl isocyanate, and monofunctional crosslinking assistants such as NK ester. The content of the crosslinking assistant is preferably 10 parts by weight or less, specifically preferably 1–5 parts by weight, relative to 100 parts by weight of EVA resin.

In order to improve the stability of the EVA resin, hydroquinone; hydroquinone monomethyl ether; p-benzoquinone; and/or methyl hydroquinone may be added. The content of such additive is preferably 5 parts by weight or less relative to 100 parts by weight of EVA resin.

If necessary, in addition to the aforementioned additives, coloring agent, ultraviolet absorbing agent, antioxidant, and/or anti-discoloration agent may be added to the EVA resin. The coloring agent is exemplified by inorganic pigments such as metallic oxide and metal powder, and organic pigments such as lake pigments of azo group, phthalocyanine group, azi group, acid dye group, and basic dye group. The ultraviolet absorbing agent is exemplified by benzophenone series compounds including 2-hydroxy-4-octoxybenzophenone and 2-hydroxy-4-methoxy-5-sulfobenzophenone, benzotriazole series compounds including 2-(2'-hydroxy-5-methylphenyl)-benzotriazole, and hindered amine series compounds including phenylsulcylate and p-t-butylphenylsulcylate. The antioxidant is exemplified by amine series compounds, phenol series compounds, bisphenyl series compound, and hindered amine series compounds. Specific examples are di-t-butyl-p-cresol and bis(2,2,6,6-tetramethyl-4-piperidyl) sebacate.

Figure 3:
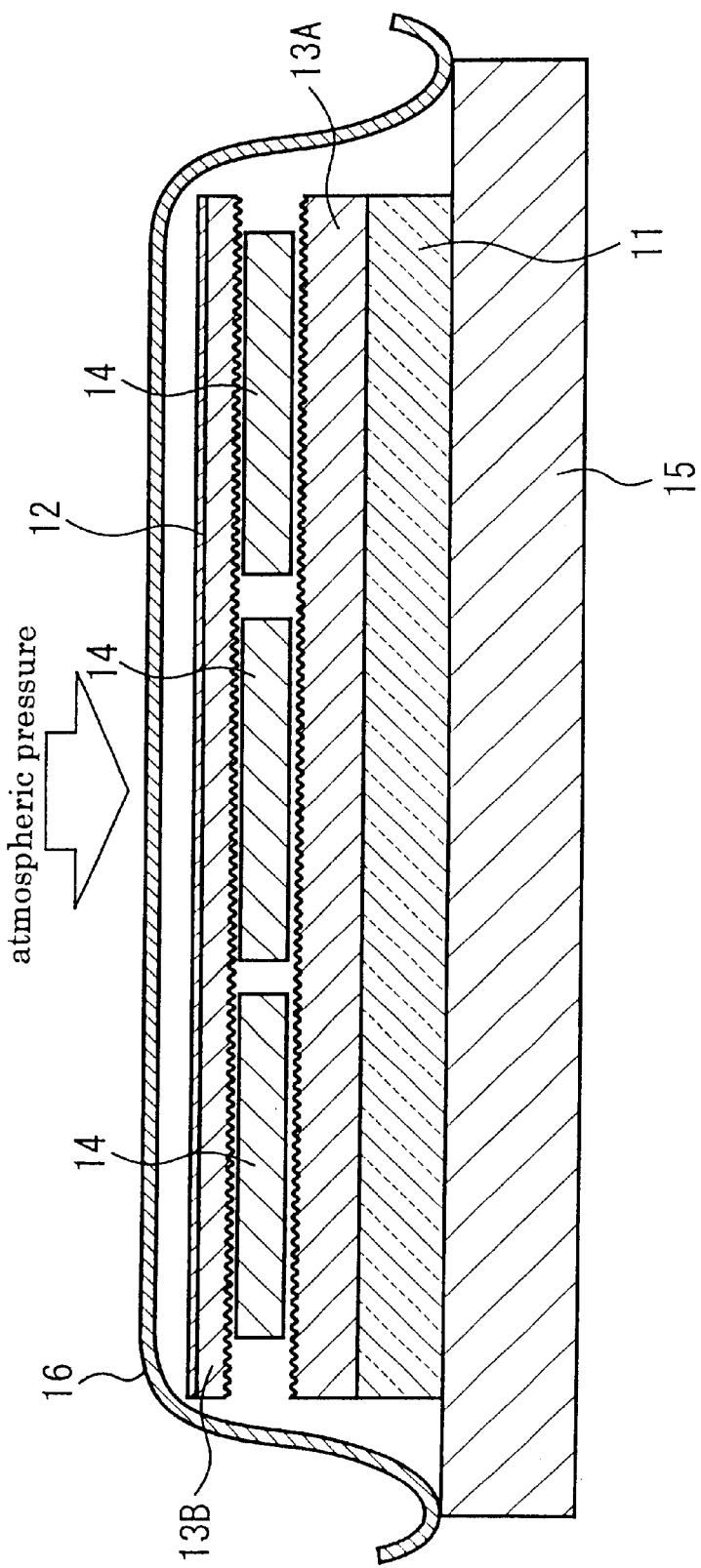
FIG. 3 is a sectional view showing an embodiment of the method of manufacturing a solar battery according to the present invention.

To manufacture the solar battery using the resultant EVA resin film, as shown in FIG. 3, the glass substrate 11, the EVA resin film 13A, silicone photovoltaic elements 14, the VA resin film 13B and the backside covering member 12 are laminated to make a laminated body. The laminated body is placed on a hot plate 5 and is enclosed by a soft sheet (diaphragm) 16 and the hot plate 15. Then, the laminated body is pressurized with atmospheric pressure by vacuuming the enclosed inside and is heated by the hot plate. Suitable heating and pressurizing conditions are temperature of the hot plate of 70–170 ° C, a time period for deaerating of 1–10 minutes, a pressure of 0.1–1 atm, and a time period for pressing of 1–10 minutes. During this heating and pressurizing, the EVA resin films 13A, 13B are cross-linked so as to form a sealing layer which is excellent in weatherability. The EVA resin films of the present invention have excellent cushioning, thereby preventing the cells from being broken due to pressure from the non-melt films during the sealing and integration process. In addition, air can be smoothly exhausted, thereby preventing air from being entrapped. Further, the resin does not flow to be flash. As a result, high quality solar batteries can be manufactured with improved product yield.

Instead of the sheet-shaped diaphragm 16, a bag may be employed. In this case, the laminated body is entered into the bag and is pressurized with atmospheric pressure by vacuuming the inside of the bag.

Specific examples of material of the diaphragm or the bag are, but not limited to, silicone rubber, fluororubber, and vulcanized rubber.

The EVA resin film 13B on the backside covering member 12 may be bonded to the backside covering member 12 prior to the integration.

Hereinafter, the present invention will be described in more detail with reference to examples and comparative examples.

EXAMPLES 1, 2, COMPARATIVE EXAMPLES 1, 2

Each film was manufactured by forming EVA resin composition containing the following components into a film and by processing the resultant EVA resin film by the embossing treatment to have the concavity ratio and depth ratio specified in Table 1. It should be noted that Comparative Example 1 was not processed by embossing treatment. Table 1 also shows the thickness of the respective films.

[Components of EVA Resin Composition]

EVA resin: 100 parts by weight

Cross-linking agent (2,5-dimethyl-2,5-bis-(t-butylperoxy) hexane): 1.3 parts by weight Silane coupling agent (γ-methacryloxypropyl trimethoxy silane): 0.3 parts by weight Crosslinking assistant (triallyl isocyanurate): 0.5 parts by weight Ultraviolet absorbing agent: 0.1 parts by weight Anti-yellowing agent: 0.3 parts by weight In each example, the content of vinyl acetate in the EVA resin film on the glass substrate was 20 weight % and the content of vinyl acetate in the EVA resin film on the backside covering member was 25 weight %. Employed as the backside covering member was a laminated film composed of PVF (38 μm), PET (75 μm), and PVF (38 μm). The backside covering member was previously bonded to the EVA resin film on the backside covering member side and thus handled as a backside covering and sealing film.

As shown in FIG. 3, each solar battery of 305 mm×305 mm was manufactured by sealing silicone photovoltaic elements between a glass substrate having thickness of 3 mm and the backside covering and sealing film. The EVA resin film on the glass substrate (hereinafter, referred to as "front-side film") and the EVA resin film on the backside covering member (hereinafter, referred to as "backside film") were placed in such a manner that their embossed surfaces faced the elements. The sealing integration was conducted by cross-linking the EVA resin, using a vacuum laminator, at a temperature of the hot plate of 150 ° C, for a time period for deaerating of 1.5 minutes, at a pressure of 1 atm, and for a time period for pressing of 5.5 minutes.

In the aforementioned manner, 100 solar batteries were manufactured for each example, damage of elements, inferiority in deaeration, and amount of EVA resin flash were measured. The results are shown in Table 1.

The damage of elements and the inferiority in deaeration are each shown by a percentage of defective products in which damaged element or inferior deaeration was seen among 100 solar batteries. A flashed amount of EVA resin is shown by the average length of the flown out resin.

TABLE 1

| | | EVA resin film | | | Solar battery | | |
|---|---|---|---|---|---|---|---|
| | Kind | Concavity ratio (%) | Maximum thickness $t_{max}$ (mm) | Depth ratio of concavities (%) | Damage of elements (%) | Inferiority in deaeration (%) | Amount of resin flash (mm) |
| Example 1 | Front-side film | 28 | 0.8 | 55 | 0 | 0 | 1.1 |
| | Backside film | 28 | 0.6 | 55 | | | |
| Example 2 | Front-side film | 35 | 0.8 | 69 | 0 | 0 | 0.5 |
| | Backside film | 35 | 0.6 | 69 | | | |
| Comparative Example 1 | Front-side film | 0 | 0.8 | 0 | 2 | 1 | 5 |
| | Backside film | 0 | 0.6 | 0 | | | |
| Comparative Example 2 | Front-side film | 90 | 0.8 | 99 | 90 | 92 | 0 |
| | Backside film | 90 | 0.6 | 99 | | | |

From Table 1, it is found that the present invention can provide high-quality solar batteries without any damage of elements and any inferiority in deaeration and with little EVA resin flash.

Industrial Applicability

As described in detail above, the cell sealing film according to the present invention can effectively prevent solar cells from being damaged or broken due to pressurizing to the cells during the sealing integration process in manufacture of a solar battery, also prevent inferior deaeration in the sealing integration process, and prevent the resin of sealing film from flashing or flowing out, thereby achieving manufacture of high quality solar batteries with high product yield.

What is claimed is:

1. A method of manufacturing a solar battery comprising:

laminating a front-side transparent protective member, a sealing layer, solar cells to be sealed by the sealing layer, another sealing layer for sealing the solar cells, and a back-side protective member to make a laminated body, placing the laminated body on a hot plate, heating said laminated body by the hot plate, pressurizing said laminated body by atmospheric pressure while the laminated body is being heated by the hot plate, wherein said sealing layers for sealing the solar cells are EVA films formed of ethylene-vinyl acetate copolymer resin, said EVA film having concavities formed by embossing, and a percentage defined by $V_H/V_A \times 100\%$ in a range from 5% to 35%, wherein $V_H$ is a total volume of said concavities per unit area of said sealing layer, and $V_A$ is an apparent volume of said sealing layer which is a product of a maximum thickness of the layer and the unit area.

2. A method of manufacturing a solar battery according to claim 1, wherein the pressurizing and heating are conducted without allowing the layers for sealing the solar cells to spew out of the laminated body.

3. A method of manufacturing a solar battery according to claim 1, wherein said laminated body is enclosed by a soft sheet and the hot plate and is pressurize with atmospheric pressure while vacuuming an inside surrounded by the soft sheet and the hot plate.

4. A method of manufacturing a solar battery according to claim 1, wherein each of said sealing layers has the concavities at one side thereof, said concavities of the sealing layers facing the solar cells.

* * * * *